United States Patent
Hara et al.

(10) Patent No.: US 11,967,493 B2
(45) Date of Patent: Apr. 23, 2024

(54) CR—SI SINTERED BODY

(71) Applicant: TOSOH CORPORATION, Shunan (JP)

(72) Inventors: Hiroyuki Hara, Ayase (JP); Hideto Kuramochi, Ayase (JP); Kenichi Itoh, Ayase (JP)

(73) Assignee: TOSOH CORPORATION, Shunan (JP)

( * ) Notice: Subject to any disclaimer, the term of this patent is extended or adjusted under 35 U.S.C. 154(b) by 151 days.

(21) Appl. No.: 17/295,191

(22) PCT Filed: Nov. 18, 2019

(86) PCT No.: PCT/JP2019/045113
§ 371 (c)(1),
(2) Date: May 19, 2021

(87) PCT Pub. No.: WO2020/105591
PCT Pub. Date: May 28, 2020

(65) Prior Publication Data
US 2022/0017424 A1 Jan. 20, 2022

(30) Foreign Application Priority Data

Nov. 22, 2018 (JP) .................................. 2018-218832
Jun. 11, 2019 (JP) .................................. 2019-108661

(51) Int. Cl.
*H01J 37/34* (2006.01)
*C04B 35/58* (2006.01)
(Continued)

(52) U.S. Cl.
CPC .... *H01J 37/3429* (2013.01); *C04B 35/58092* (2013.01); *C23C 14/0682* (2013.01);
(Continued)

(58) Field of Classification Search
CPC ............. H01J 37/3429; C23C 14/0682; C23C 14/3414; C04B 35/58092;
(Continued)

(56) References Cited

U.S. PATENT DOCUMENTS 4,379,852 A  4/1983 Watanabe et al.

FOREIGN PATENT DOCUMENTS

CN  101198716 A  6/2008
CN  105331939 A  2/2016
(Continued)

OTHER PUBLICATIONS

Machine Translation JP 2003167324 A (Year: 2003).*
(Continued)

*Primary Examiner* — Michael A Band
(74) *Attorney, Agent, or Firm* — Oblon, McClelland, Maier & Neustadt, L.L.P.

(57) ABSTRACT

It is difficult for a Cr—Si-based sintered body composed of chromium silicide ($CrSi_2$) and silicon (Si) to have high strength.
Provided is a Cr—Si-based sintered body including Cr (chromium) and silicon (Si), in which the crystal structure attributed by X-ray diffraction is composed of chromium silicide ($CrSi_2$) and silicon (Si), a $CrSi_2$ phase is present at 60 wt % or more in a bulk, a density of the sintered body is 95% or more, and an average grain size of the $CrSi_2$ phase is 60 μm or less.

10 Claims, 1 Drawing Sheet

(51) Int. Cl.
*C23C 14/06* (2006.01)
*C23C 14/34* (2006.01)

(52) U.S. Cl.
CPC .. *C23C 14/3414* (2013.01); *C04B 2235/3891* (2013.01); *C04B 2235/428* (2013.01); *C04B 2235/77* (2013.01); *C04B 2235/786* (2013.01)

(58) Field of Classification Search
CPC ...... C04B 2235/3891; C04B 2235/428; C04B 2235/786
See application file for complete search history.

(56) References Cited

FOREIGN PATENT DOCUMENTS

| | | | | |
|---|---|---|---|---|
| EP | | 735159 A1 | * 10/1996 | ....... C04B 35/58085 |
| JP | | 2-111614 A | 4/1990 | |
| JP | | 3-105901 A | 5/1991 | |
| JP | | 8-20863 A | 1/1996 | |
| JP | | 2002-173765 A | 6/2002 | |
| JP | | 2003-167324 A | 6/2003 | |
| JP | | 2004-204278 A | 7/2004 | |
| JP | | 2013-502368 A | 1/2013 | |
| JP | | 2017-82314 A | 5/2017 | |
| WO | WO 2011/022058 A1 | | 2/2011 | |
| WO | WO 2017/073487 A1 | | 5/2017 | |

OTHER PUBLICATIONS

Extended European Search Report dated Jul. 21, 2022 in European Patent Application No. 19887300.2, 8 pages.
International Search Report dated Dec. 24, 2019 in PCT/JP2019/045113, 1 page.
International Preliminary Report on Patentability dated Jun. 3, 2021 in PCT/JP2019/045113 (submitting English translation only) 7 pages.

* cited by examiner

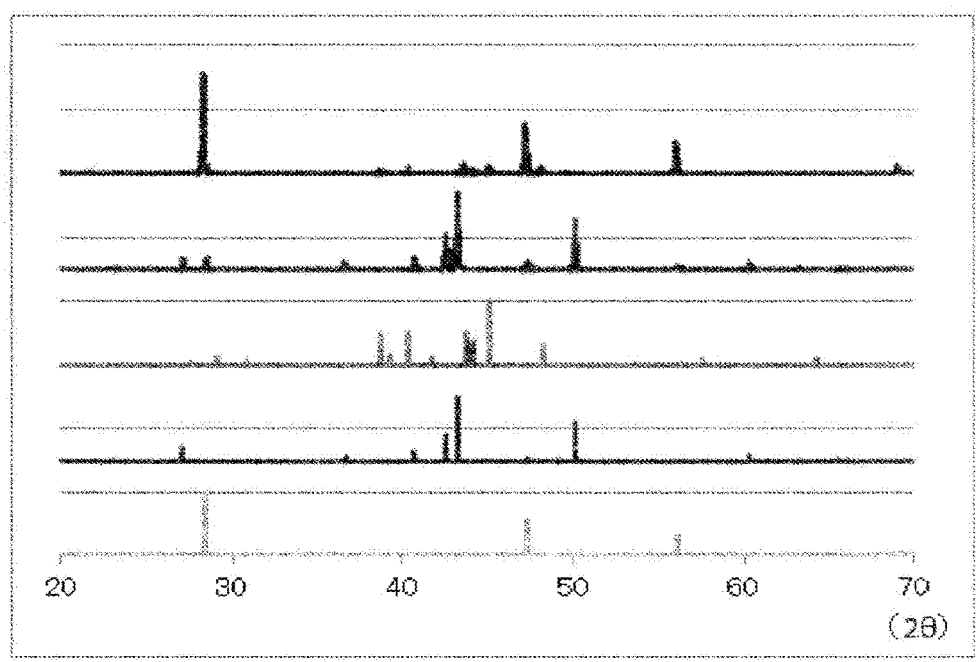

CR—SI SINTERED BODY

TECHNICAL FIELD

The present invention relates to a Cr—Si-based sintered body for forming a thin film.

BACKGROUND ART

In recent years, silicides such as $CrSi_2$ are used as thin films in numerous situations such as semiconductors and solar cells, due to the characteristics of the silicides. In the production of a thin film, a sputtering method is industrially employed in many cases. However, a composition including a silicide such as $CrSi_2$ generally has low strength, and there is a phenomenon that cracking occurs during processing of a sputtering target and during discharging in film formation, so that it is known to be difficult to use the silicide as a sputtering target. Thus, in Patent Literature 1, a sputtering target of a crystal phase of Cr and Si is produced by a thermal spraying method. However, in the thermal spraying method, the strength is not increased sufficiently at sites where the distribution of Cr is small, and a sputtering target produced by the thermal spraying method using a powder of a silicide phase does not acquire higher strength.

Furthermore, in Patent Literature 2, a composition having a fine eutectic texture by a melting method is produced. However, in the melting method, strength increase cannot be achieved with a composition in which the proportion of the eutectic texture is small and many primary crystals are present. Furthermore, when the size of the composition is increased, it becomes difficult to control the crystal texture due to the difference in the cooling rate, and the unevenness of strength becomes large.

In addition, in Patent Literatures 3 and 4, nothing is mentioned about a system including a large amount of a silicide because the silicide phase is brittle.

CITATION LIST

Patent Literature

Patent Literature 1: Japanese Unexamined Patent Publication No. 2017-82314
Patent Literature 2: Japanese Unexamined Patent Publication No. 2013-502368 (Translation of PCT International Application Publication)
Patent Literature 3: Japanese Unexamined Patent Publication No. 2002-173765
Patent Literature 4: Japanese Unexamined Patent Publication No. 2003-167324

SUMMARY OF INVENTION

Problems to be Solved by the Invention

An object of the present invention is to provide a high-strength Cr—Si-based sintered body including Cr (chromium) and silicon (Si).

Means to Solve Problems

The inventors of the present invention conducted a diligent consideration on a production process for a Cr—Si-based sintered body composed of chromium silicide ($CrSi_2$) and silicon (Si) in the stoichiometric composition having a specific amount or more of the $CrSi_2$ phase, and as a result, the inventors found that a high-strength Cr—Si-based sintered body is obtained by using a rapidly quenched alloy powder such as a gas atomized powder, thus completing the present invention.

That is, the present invention has the following substances.

(1) A Cr—Si-based sintered body comprising Cr (chromium) and silicon (Si), wherein the crystal structure attributed by X-ray diffraction is composed of chromium silicide ($CrSi_2$) and silicon (Si), a $CrSi_2$ phase is present at 60 wt % or more in a bulk, a density of the sintered body is 95% or more, and an average grain size of the $CrSi_2$ phase is 60 µm or less.

(2) The Cr—Si-based sintered body according to (1), wherein a flexural strength is 100 MPa or more.

(3) The Cr—Si-based sintered body according to (1) or (2), wherein an amount of oxygen in the bulk is 1 wt % or less.

(4) A sputtering target comprising the Cr—Si-based sintered body according to any one of (1) to (3).

(5) A method for producing a thin film, the method comprising performing sputtering using the sputtering target according to (4).

Advantageous Effects of Invention

The Cr—Si-based sintered body of the present invention has high strength, and in a case where the Cr—Si-based sintered body is used as a sputtering target, cracking does not occur even under high power output, while high productivity can be obtained. More preferably, since an amount of oxygen is small, it is possible to reduce a number of particles during film formation.

BRIEF DESCRIPTION OF DRAWINGS

FIG. 1 shows X-ray analysis diagrams for Example 1 and Comparative Example 3. Hereinafter, the present invention will be described in detail.

The present invention is a Cr—Si-based sintered body including Cr (chromium) and silicon (Si), in which the crystal structure attributed by X-ray diffraction is composed of chromium silicide ($CrSi_2$) and silicon (Si), a $CrSi_2$ phase is present at 60 wt % or more in a bulk, a density of the sintered body is 95% or more, and an average grain size of the $CrSi_2$ phase is 60 µm or less.

The crystal phase of the Cr—Si-based sintered body of the present invention is characterized by being a system composed of a chromium silicide ($CrSi_2$) phase and a silicon (Si) phase in XRD. When a silicidation reaction does not sufficiently proceed, and other silicide phases ($Cr_3Si$, $Cr_5Si_3$, CrSi) and a chromium (Cr) phase, which should not be originally present in the composition, are locally present, microcracks are inherent due to the difference in density, particularly a large-sized sintered body is fragile, and sintered products cannot be produced at high yield ratio. Furthermore, in a case where high power is input in a sputtering using such a sintered body, cracks are likely to be generated during discharge and cause a decrease in productivity in a film-forming process, which is not preferable.

The Cr—Si-based sintered body of the present invention has a feature that the $CrSi_2$ phase is present at 60 wt % or more in the bulk. The proportion is preferably 70 wt % or more, and particularly preferably 80 wt % or more.

The Cr—Si-based sintered body of the present invention is characterized by that a density of the sintered body is 95% or more as a relative density. When the density of sintered body is less than 95%, strength is decreased. Furthermore, in a case where the Cr—Si-based sintered body is used as a sputtering target, since the frequency of arcing increases, the density of the sintered body is preferably 97% or more, and more preferably 98% or more.

Furthermore, the Cr—Si-based sintered body of the present invention is characterized by that the grain size of chromium silicide is 60 µm or less. When the grain size is larger than 60 µm, strength is rapidly decreased. In order to stably obtain high strength, the grain size is preferably 1 to 60 µm, more preferably 1 to 20 µm, and particularly preferably 1 to 10 µm.

An amount of oxygen in the bulk of the Cr—Si-based sintered body of the present invention is preferably 1 wt % or less, preferably 0.5 wt % or less, even more preferably 0.1 wt % or less, and still more preferably 0.05 wt % or less, from the viewpoint of the generation of particles when the sintered body is used as a film, and from the viewpoint of a yield ratio of a film product.

A flexural strength of the Cr—Si-based sintered body of the present invention is preferably 100 MPa or more, more preferably 100 to 500 MPa, even more preferably 150 to 500 MPa, and particularly preferably 200 to 500 MPa. When the strength of the sintered body is high, cracking is not likely to occur even in a grinding process and a bonding process, thus the yield ratio is high and the productivity is good. Furthermore, even in a case where high power is input during sputtering, a problem of cracking is not likely to occur.

The Cr—Si-based sintered body of the present invention may include 1 wt % or less in total of inevitable metal impurities other than Cr (chromium) and silicon (Si), and the sintered body may preferably include 0.5 wt % or less, more preferably 0.05 wt % or less, and even more preferably 0.01 wt % or less, of the inevitable metal impurities.

Regarding the inevitable metal impurities other than Cr (chromium) and silicon (Si), the Cr—Si-based sintered body may include metal impurities such as Fe, Ni, Al, Mn, and Cu in particular at 1 wt % or less in total, and the sintered body may include preferably 0.5 wt % or less, more preferably 0.05 wt %, and even more preferably 0.01 wt % or less, of the metal impurities.

Regarding individual elements, the Cr—Si-based sintered body may include 0.1 wt % or less, preferably 0.05 wt % or less, and more preferably 0.01 wt % or less, of Fe. The Cr—Si-based sintered body may include 0.01 wt % or less, preferably 0.005 wt % or less, and more preferably 0.001 wt % or less, of Ni. The Cr—Si-based sintered body may include 0.1 wt % or less, preferably 0.05 wt % or less, and more preferably 0.01 wt % or less, of Al. The Cr—Si-based sintered body may include 0.005 wt % or less, preferably 0.001 wt % or less, and more preferably 0.005 wt % or less, of Mn. The Cr—Si-based sintered body may include 0.01 wt % or less, preferably 0.005 wt % or less, and more preferably 0.001 wt % or less, of Cu.

Next, a method for producing a Cr—Si-based sintered body of the present invention will be explained.

In the method for producing a Cr—Si-based sintered body of the present invention, the Cr—Si-based sintered body can be produced by steps including: (1) an alloy raw material preparation step based on a gas atomization method, an arc melting method, or the like using chromium and silicon; and (2) a sintering step of sintering the obtained raw material powder at a pressure of 50 MPa or less and a sintering temperature of 1100° C. to 1300° C. using a pressurization sintering furnace such as a hot press furnace.

In the following description, each of the steps of the method for producing a Cr—Si-based sintered body of the present invention will be explained.

(1) Alloy Raw Material Preparation Step

Chromium and silicon are used as raw materials. The purity of the raw materials is preferably 99.9% or more, and more preferably 99.99% or more. When a large amount of impurities is included, the impurities cause of abnormal grain growth in the sintering step and the impurities become a source of particle generation during film formation. Furthermore, it is preferable that an amount of oxygen in the raw material is small. When an amount of oxygen in the raw material is large, an amount of oxygen in the sputtering target finally becomes large, and the oxygen becomes a cause of generation of particles.

A synthetic raw material powder can be produced by a gas atomization method or an arc melting method.

It is preferable that the alloy raw material powder having a fine texture is produced through rapid cooling by a gas atomization method or the like. Particularly, particles produced by a gas atomization method have a spherical shape with a size of about several dozen micrometers (µm) and the particles have a fine $CrSi_2$ phase and a fine Si phase in the spherical shape. Since the particles are fine grains having a small surface area, the sintered body obtained after sintering can have less oxygen and high strength. It is possible to produce a high-strength bulk through mixing fine powders; however, an amount of oxygen increases. In contrast, it is possible to reduce oxygen through mixing coarse grains; however, the strength is decreased. Other examples of the raw material production method include rapid cooling methods such as rapid cooling ribbon and arc melting.

It is preferable that a melting temperature which is a condition for the gas atomization method is preferably +50 to 300° C., more preferably +100 to 250° C. Here, the melting temperature represents a temperature at which the raw material powder melts, and usually, the melting temperature is 1300 to 1500° C. In a case where the difference from the melting temperature is small, a phase having a higher melting point between the two crystal phases precipitates first, and it is difficult to make the particles finer. Meanwhile, when the difference from the melting temperature is large, since particles are sintered together after atomization and adhere to a wall surface, a collection rate of powder collection becomes poor.

Furthermore, it is preferable that the powder after gas atomization is managed in a vacuum or in an inert atmosphere such as nitrogen, argon, or the like. When the powder is left in air, oxidization occurs at the surface, and an amount of oxygen in the powder increases.

With regard to conditions for the arc melting method, an output power of the arc is important. It is determined thereby whether materials having a large difference in the melting point can be alloyed. For example, in the case of chromium and silicon, since the melting point of chromium is 1863° C. while the melting point of silicon is 1414° C., it is necessary to melt the materials with an output power of 50 to 200 A. When the arc current is too high, an amount of sublimation of chromium increases, and therefore, the output power for arc melting is preferably in the range of 50 to 150 A.

(2) Sintering Step

Next, it is preferable to use a pressurization sintering furnace such as a hot press furnace for the obtained powder. It is difficult to obtain a sintered body with high density by a non-pressurized furnace because the diffusion coefficient of silicon is low.

It is preferable to adjust a hot press pressure during sintering to 50 MPa or less. When the hot press pressure exceeds 50 MPa, it is difficult to prepare a hot press mold that can be pressurized. The hot press pressure for producing a large-sized sintered body is preferably 5 to 50 MPa, more preferably 5 to 20 MPa, and particularly preferably 5 to 10 MPa.

A sintering temperature is set to 1100° C. to 1300° C. When the sintering temperature is below 1100° C., the density does not sufficiently increase, and when the sintering temperature exceeds 1300° C., there is a possibility that melting may occur depending on the hot press pressure. Furthermore, the rate of temperature decrease is not particularly limited and can be appropriately determined by considering a capacity of the sintering furnace, size and shape of the sintered body, fragility, and the like.

A retention time during sintering is set to be within 1 to 5 hours. When the retention time is shorter than 1 hour, temperature unevenness occurs inside the furnace and inside the hot press mold, and it is difficult to obtain a uniform crystalline texture. In contrast, when the retention time is long, productivity becomes poor.

A atmosphere during sintering is not particularly limited, and a vacuum or an inert atmosphere of argon or the like is preferred.

The Cr—Si-based sintered body of the present invention can be ground into a plate-like shape using a machining machine such as a surface grinding machine, a cylindrical grinding machine, a lathe, a cutting machine, or a machining center.

The Cr—Si-based sintered body of the present invention can be used as a sputtering target formed from the Cr—Si-based sintered body of the present invention. Regarding a method for producing the sputtering target, the sputtering target can be obtained by joining (bonding) the Cr—Si-based sintered body to a backing plate or a backing tube made of oxygen-free copper, titanium, or the like using indium solder or the like, as necessary.

Furthermore, it is also possible to produce a thin film by performing sputtering using the obtained sputtering target.

EXAMPLES

Hereinafter, the present invention will be described more specifically by way of Examples; however, the present invention is not intended to be limited to them. Meanwhile, various measurements made in the present Examples were carried out as follows.

(1) Density of Sintered Body

Regarding a relative density of a sintered body, the relative density was determined according to JIS R 1634, by measuring a bulk density by an Archimedes' method and dividing the bulk density by a true density. The true density of the sintered body was obtained by using a weight a [g] of a $CrSi_2$ phase and a weight b [g] of a Si phase and the respective true densities, 4.98 [g/cm$^3$] and 2.3 [g/cm$^3$], of the phases, and calculating an arithmetic mean represented by the following formula.

$$d=(a+b)/((a/4.98)+(b/2.3))$$

(2) X-Ray Diffraction Test

An X-ray diffraction pattern in a range of 2θ=20 to 70° of a mirror-polished sintered body was measured.
Scanning Method: Step Scanning Method (FT Method)
X-ray source: CuKα
Power: 40 kV, 40 mA
Step width: 0.01°

(3) Sintered Body Grain Size

From an image of a sintered body texture obtained by mirror-polishing a sintered body and observing the sintered body with a scanning electron microscope, the sintered body grain size was measured by a diameter method. Observation was made at at least any three or more sites, and measurements of 300 or more particles were carried out.
(Observation Conditions for Scanning Electron Microscopy)
Accelerating voltage: 10 kV (4) Flexural Strength The flexural strength was measured according to JIS R 1601.
(Measurement Conditions for Flexural Strength)
Test method: Three-point bending test
Distance between fulcrums: 30 mm
Sample size: 3×4×40 mm
Head speed: 0.5 mm/min (5) Analysis of Amount of Oxygen An analysis value of a sample cut out from any part after grinding 1 mm or more from the surface of a sintered body after sintering was used as measurement data.
Measurement Method: Impulse Furnace Melting-Infrared Absorption Method
Apparatus: LECO TC436 oxygen and nitrogen analyzer (6) Analysis of Amount of Metal Impurities An analysis value of a sample cut out from any part after grinding 1 mm or more from the surface of a sintered body after sintering was used as measurement data.

Measurement Method: Glow Discharge Mass Analysis (GDMS)

Example 1

Cr flakes (4N): 42 wt % and Si flakes (5N): 58 wt % were melted in a carbon crucible, and a powder was produced by a gas atomization method at a melting temperature to 1650° C. Particle size adjustment of the powder was carried out by sieving (sieve mesh size: 300 μm) the powder in air.

Next, this powder was introduced into a carbon mold (53 mmϕ) and sintered by a hot press method to obtain a sintered body.
(Sintering Conditions)
Sintering furnace: Hot press furnace
Rate of temperature increase: 200° C./hour
Atmosphere for temperature increase: Vacuum reduced-pressure atmosphere
Sintering temperature: 1250° C.
Pressure: 10 MPa
Sintering time: 3 hours
A microcrack-free sintered body having a sintered body size of 53 mmϕ×7 mmt was obtained. The sintered body characteristics are shown in Table 1.

Examples 2 to 5

Sintered bodies were produced by methods similar to that of Example 1, except that the sintering conditions were changed. The sintered body characteristics of the sintered bodies are shown in Table 1.

Example 6

Cr flakes (4N): 29 wt % and Si flakes (5N): 71 wt % were melted by an arc melting method under a condition of an output power of 100 A. The obtained bulk was pulverized in a mortar and sintered under the conditions of Example 3. The characteristics of the sintered body are shown in Table 1.

Example 7

Cr flakes (4N): 42 wt % and Si flakes (5N): 58 wt % were melted in a carbon crucible, and a powder was produced by a gas atomization method at a melting temperature of 1650° C. The powder was sieved (sieve mesh size: 300 μm) in a glove box (oxygen concentration: 0.1 wt % or less) to perform particle size adjustment of the powder.

Next, this powder was introduced into a carbon mold (53 mmdi) and sintered by a hot press method to obtain a sintered body.

(Sintering Conditions)
Sintering furnace: Hot press furnace
Rate of temperature increase: 200° C./hour
Atmosphere for temperature increase: Vacuum reduced-pressure atmosphere
Sintering temperature: 1200° C.
Pressure: 20 MPa
Sintering time: 3 hours A microcrack-free sintered body having a sintered body size of 53 mmϕ×7 mmt was obtained. The sintered body characteristics of are shown in Table 1. Furthermore, an amount of metal impurities was analyzed by GDMS, and a total amount of metal impurities other than Cr and Si was 0.034 wt % or less, while amounts of individual impurities were 0.0066 wt % of Fe, 0.00082 wt % of Ni, 0.000048 wt % of Al, 0.00011 wt % of Mn, and 0.000051 wt % of Cu.

Example 8

Cr flakes (4N): 29 wt % and Si flakes (5N): 71 wt % were melted in a carbon crucible, and a powder was produced by a gas atomization method at a melting temperature of 1540° C. The powder was sieved (sieve mesh size: 300 μm) in a glove box (oxygen concentration: 0.1 wt % or less) to perform particle size adjustment of the powder.

Next, this powder was introduced into a carbon mold (53 mmϕ) and sintered by a hot press method to obtain a sintered body.

(Sintering Conditions)
Sintering furnace: Hot press furnace
Rate of temperature increase: 200° C./hour
Atmosphere for temperature increase: Vacuum reduced-pressure atmosphere
Sintering temperature: 1200° C.
Pressure: 20 MPa
Sintering time: 3 hours A microcrack-free sintered body having a sintered body size of 53 mmϕ×7 mmt was obtained. The sintered body characteristics of are shown in Table 1. Furthermore, an amount of each metal impurity was analyzed by GDMS, and a total amount of metal impurities other than Cr and Si was 0.026 wt % or less, while amounts of individual impurities were 0.0027 wt % of Fe, 0.00039 wt % of Ni, 0.000022 wt % of Al, 0.000041 wt % of Mn, and 0.000012 wt % of Cu.

Example 9

A sintered body was produced by a method similar to that of Example 8, except that the sintering conditions were changed. The sintered body characteristics of the sintered body are shown in Table 1.

Example 10

Cr flakes (4N): 47 wt % and Si flakes (5N): 53 wt % were melted in a carbon crucible, and a powder was produced by a gas atomization method at a melting temperature of 1540° C. The powder was sieved (sieve mesh size: 300 μm) in a glove box (oxygen concentration: 0.1 wt % or less) to perform particle size adjustment of the powder.

Next, this powder was introduced into a carbon mold (53 mmϕ) and sintered by a hot press method to obtain a sintered body.

(Sintering Conditions)
Sintering furnace: Hot press furnace
Rate of temperature increase: 200° C./hour
Atmosphere for temperature increase: Vacuum reduced-pressure atmosphere
Sintering temperature: 1200° C.
Pressure: 20 MPa
Sintering time: 3 hours A microcrack-free sintered body having a sintered body size of 53 mmϕ×7 mmt was obtained. The sintered body characteristics of are shown in Table 1. Furthermore, an amount of each metal impurity was analyzed by GDMS, and a total amount of metal impurities other than Cr and Si was 0.03 wt % or less, while amounts of individual impurities were 0.0062 wt % of Fe, 0.00078 wt % of Ni, 0.000035 wt % of Al, 0.000068 wt % of Mn, and 0.000041 wt % of Cu.

Example 11

A sintered body was produced by a method similar to that of Example 10, except that the sintering conditions were changed. The sintered body characteristics of the sintered body are shown in Table 1.

Comparative Example 1

Cr flakes (4N): 42 wt % and Si flakes (5N): 58 wt % were melted by an arc melting method. The characteristics of the bulk obtained after melting are shown in Table 1.

Comparative Example 2

The bulk produced in Comparative Example 1 was pulverized in a mortar and a sintered body was produced by a hot press method. The sintered body characteristics are shown in Table 1.

Comparative Example 3

A Cr powder (45 μm) and a Si powder (9 μm) were mixed by a V-type mixing method, and the mixed powder was hot pressed to produce a sintered body. The sintered body characteristics are shown in Table 1.

Comparative Example 4

A powder produced by a gas atomization method was sintered by changing the sintering conditions. The sintered body characteristics are shown in Table 1.

Comparative Example 5

Cr flakes (4N): 29 wt % and Si flakes (5N): 71 wt % were melted by an arc melting method. The characteristics of the bulk obtained after melting are shown in Table 1.

TABLE 1

| | Cr (wt %) | Si (wt %) | Bulk production method | Temperature (° C.) | Pressure (MPa) | Retention time (h) | Crystal phase | $CrSi_2$ phase proportion (wt %) | $CrSi_2$ phase grain size (μm) | Density (%) | Flexural strength (MPa) | Amount of oxygen (wt %) |
|---|---|---|---|---|---|---|---|---|---|---|---|---|
| Example 1 | 42 | 58 | Gas atomization + hot press | 1250 | 10 | 3 | $CrSi_2$, Si | 87.1 | 7 | 99.0 | 255 | 0.5 |
| Example 2 | 42 | 58 | Gas atomization + hot press | 1200 | 10 | 3 | $CrSi_2$, Si | 87.1 | 7 | 98.8 | 249 | 0.5 |
| Example 3 | 42 | 58 | Gas atomization + hot press | 1150 | 10 | 3 | $CrSi_2$, Si | 87.1 | 6 | 95.9 | 204 | 0.6 |
| Example 4 | 42 | 58 | Gas atomization + hot press | 1150 | 40 | 3 | $CrSi_2$, Si | 87.1 | 7 | 99.4 | 247 | 0.6 |
| Example 5 | 42 | 58 | Gas atomization + hot press | 1050 | 40 | 3 | $CrSi_2$, Si | 87.1 | 6 | 95.9 | 166 | 0.6 |
| Example 6 | 29 | 71 | Arc melting + hot press | 1150 | 40 | 3 | $CrSi_2$, Si | 60.1 | 58 | 97.1 | 129 | 0.1 |
| Example 7 | 42 | 58 | Gas atomization + hot press | 1200 | 20 | 3 | $CrSi_2$, Si | 87.1 | 6 | 99.9 | 321 | 0.02 |
| Example 8 | 29 | 71 | Gas atomization + hot press | 1200 | 20 | 3 | $CrSi_2$, Si | 60.1 | 3 | 97.6 | 245 | 0.02 |
| Example 9 | 29 | 71 | Gas atomization + hot press | 1250 | 20 | 3 | $CrSi_2$, Si | 60.1 | 3 | 99.9 | 277 | 0.01 |
| Example 10 | 47 | 53 | Gas atomization + hot press | 1200 | 20 | 3 | $CrSi_2$, Si | 97.6 | 9 | 96.6 | 185 | 0.02 |
| Example 11 | 47 | 53 | Gas atomization + hot press | 1250 | 20 | 3 | $CrSi_2$, Si | 97.6 | 10 | 99.0 | 192 | 0.02 |
| Comparative Example 1 | 42 | 58 | Arc melting | — | — | — | $CrSi_2$, Si | 87.1 | 223 | 99.8 | 9 | 0.01 |
| Comparative Example 2 | 42 | 58 | Arc melting + hot press | 1150 | 40 | 3 | $CrSi_2$, Si | 87.1 | 106 | 97.3 | 50 | 0.1 |
| Comparative Example 3 | 42 | 58 | Powder mixing + hot press | 1150 | 40 | 3 | $Cr_5Si_3$, Si | — | — | 75.6 | 31 | 1.1 |
| Comparative Example 4 | 42 | 58 | Gas atomization + hot press | 1000 | 10 | 3 | $CrSi_2$, Si | 87.1 | 4 | 92.3 | 84 | 0.6 |
| Comparative Example 5 | 29 | 71 | Arc melting | — | — | — | $CrSi_2$, Si | 60.1 | 144 | 99.7 | 68 | 0.02 |

The present invention was described in detail with reference to specific embodiments; however, it is obvious to those ordinarily skilled in the art that various modifications and corrections can be made without departing from the idea and scope of the present invention.

The present patent application is based on Japanese Patent Application filed on Nov. 22, 2018 (Japanese Patent Application No. 2018-218832) and Japanese Patent Application filed on Jun. 11, 2019 (Japanese Patent Application No. 2019-108661), the entire disclosures of which are incorporated herein by reference. Furthermore, all references cited herein are incorporated as their entireties.

The invention claimed is:

1. A Cr—Si-based sintered body, consisting of: a sintered body comprising chromium and silicon and having a crystal structure, wherein the crystal structure attributed by X-ray diffraction includes $CrSi_2$ and silicon such that a $CrSi_2$ phase is present at 60.1 wt % to 97.6 wt % in a bulk, a density of the sintered body is from 96.6% to 99.9%, an average grain size of the $CrSi_2$ phase is from 3 um to 10 um, and the sintered body includes inevitable metal impurities other than chromium and silicon such that an amount of the inevitable metal impurities is 1 wt % or less in the bulk, and the sintered body has an oxygen amount of 0.02 wt % or less in the bulk, wherein the sintered body has a flexural strength of from 185 M Pa to 321 M Pa.

2. A sputtering target, comprising:
the Cr—Si-based sintered body of claim 1.

3. A method for producing a thin film, comprising:
performing sputtering using the sputtering target of claim 2.

4. The Cr—Si-based sintered body according to claim 1, wherein the amount of the inevitable metal impurities in the sintered body is 0.5 wt % or less in the bulk.

5. The Cr—Si-based sintered body according to claim 1, wherein the amount of the inevitable metal impurities in the sintered body is 0.05 wt % or less in the bulk.

6. The Cr—Si-based sintered body according to claim 1, wherein the crystal structure attributed by X-ray diffraction includes $CrSi_2$ and silicon such that the $CrSi_2$ phase is present at 70 wt % to 97.6 wt % in the bulk.

7. The Cr—Si-based sintered body according to claim 1, wherein the crystal structure attributed by X-ray diffraction includes $CrSi_2$ and silicon such that the $CrSi_2$ phase is present at 80 wt % to 97.6 wt % in the bulk.

8. The Cr—Si-based sintered body according to claim 1, wherein the sintered body has the flexural strength of from 185 MPa to 277 MPa.

9. The Cr—Si-based sintered body according to claim 1, wherein the sintered body has the flexural strength of 185 MPa to 245 MPa.

10. The Cr—Si-based sintered body according to claim 1, wherein the sintered body has the flexural strength in a range of from 185 MPa to 200 MPa.

* * * * *